United States Patent [19]

Shimoyama et al.

[11] Patent Number: 5,376,581
[45] Date of Patent: Dec. 27, 1994

[54] FABRICATION OF SEMICONDUCTOR LASER ELEMENTS

[75] Inventors: Kenji Shimoyama; Yuichi Inoue; Hideki Gotoh, all of Ushiku, Japan

[73] Assignee: Mitsubishi Kasei Corporation, Tokyo, Japan

[21] Appl. No.: 118,792

[22] Filed: Sep. 10, 1993

[30] Foreign Application Priority Data

Sep. 11, 1992 [JP] Japan .................. 4-243699

[51] Int. Cl.⁵ ............................................. H01L 21/20
[52] U.S. Cl. ............................ 437/129; 148/DIG. 95
[58] Field of Search .................. 437/129; 148/DIG. 95

[56] References Cited

U.S. PATENT DOCUMENTS

| | | | |
|---|---|---|---|
| 4,835,117 | 5/1989 | Ohba et al. ............... | 148/DIG. 95 |
| 5,053,356 | 10/1991 | Mitsui et al. ............ | 437/129 |
| 5,304,507 | 4/1994 | Unozawa .................. | 437/129 |

FOREIGN PATENT DOCUMENTS

| | | | |
|---|---|---|---|
| 260185 | 12/1985 | Japan ................... | 437/129 |
| 100788 | 5/1988 | Japan ................... | 437/129 |

*Primary Examiner*—R. Bruce Breneman
*Assistant Examiner*—Linda J. Fleck
*Attorney, Agent, or Firm*—Armstrong, Westerman, Hattori, McLeland & Naughton

[57] ABSTRACT

In a process for fabricating a semiconductor laser by forming a double-heterostructure made up of a first cladding layer, an active layer and a second cladding layer on a semiconductor substrate at the first growth step, forming protecting films for selective growth on both sides of a striped region for current injection, without etching the second cladding layer, and growing a third cladding layer and a contact layer for current injection at a second growth step, the second cladding layer formed at the first growth step is grown to the thickness required for achieving laser characteristics.

5 Claims, 3 Drawing Sheets

FABRICATION OF SEMICONDUCTOR LASER ELEMENTS

BACKGROUND OF THE INVENTION

The present invention relates to a semiconductor laser element and a process for fabricating it.

To fabricate semiconductor laser elements easily, a structure called a ridge waveguide type is often used. FIG. 1 is an illustrative schematic of how to prepare that structure. First, an n-type cladding layer 102, an active layer 103, a p-type cladding layer 104 and a p-type contact layer 105 are grown on a substrate 101. Then, a striped shaped resist is formed on the surface of the wafer by photolithographic patterning. Following this, the resist is used as a mask to wet etch the wafer in such a way that the p-type cladding layer is left with only a desired thickness, thereby forming a striped form of ridge. By use of this ridge structure, it is possible to stabilize the lateral mode of operation and reduce threshold currents in laser oscillation.

The fundamental properties of the thus prepared semiconductor laser element are determined by the thickness $d_p$ (106) of the remaining cladding layer and the ridge width W (107). For instance, if $d_p$ becomes too thick, there is then a threshold current increase, which will be less effective for lateral light confinement. In contrast, if $d_p$ becomes too thin, there is then a working current decrease, which will make lateral light confinement more intense. At a large W the laser beam diverges very little in the lateral direction, whereas at a small W the laser beam diverges appreciably. To obtain desired semiconductor lasers in good-enough yields, it is necessary to place these two values under strict control. In conventional processes, however, the value of $d_p$ has a large distribution within the plane of the wafer, because both the uniformity of the film thickness of the grown crystal and the accuracy of etching depth pose problems in the formation of a DH structure.

As illustrated in FIG. 2, there is a twin-striped (TS) laser that is a modified ridge type laser. Upon controlled in terms of the lateral mode of operation, this TS laser is known to have useful characteristics such as current-light non-linearity characteristics and far field beam deflection. So far, TS lasers have been provided with two sets of ridges by wet etching in conventional manners. With this procedure, however, difficulty was involved in placing not only the above-mentioned $d_p$ (201), $W_1$ (202) and $W_2$ (203) but also a distance, t (204), between two stripes and an etching depth of striped groove (205) under precise control. These TS laser characteristics are closely correlated with the symmetry of the two ridges. Without having a precise understanding of these structural parameters, it is impossible to extract excellent characteristics form TS lasers.

As a result of strenuous studies, the inventors have now found that such a problem arises from the insufficient uniformity of the p-cladding layer and insufficient accuracy of etching depth. Thus, it has now been discovered that the thickness $d_p$ of the remaining cladding layer cannot only be controlled more accurately but the relative arrangement of the ridges can be kept in good condition as well by doing the control of $d_p$ without recourse to etching, resulting in the achievement of stable and improved laser characteristics. This discovery underlies the invention.

SUMMARY OF THE INVENTION

An object of the invention is thus to provide a process for fabricating semiconductor lasers having constant laser characteristics as desired and in high-enough yields.

According to the invention, this object is achieved by the provision of a process for fabricating a semiconductor laser by forming a double-heterostructure made up of a first cladding layer, an active layer and a second cladding layer on a semiconductor substrate at the first growth step, forming selective growth protecting films on both sides of a striped region for current injection, without etching the second cladding layer, and growing a third cladding layer and a contact layer for current injection at a second growth step, wherein the second cladding layer formed at the first growth step is grown to the thickness required for achieving laser characteristics.

Preferably, the semiconductor laser element is a twin-striped laser element.

Preferably, the distance between one set of ridges of the twin-striped laser element is 3 to 5 $\mu$m.

Preferably, the above-mentioned selective growth is carried out by a vapor-phase growth technique using an organic metal and, at the same time, halide or halogen gas is introduced in a growth chamber during the selective growth so as to prevent the deposition of polycrystals on the selective growth protecting films.

Preferably, the halide or halogen gas is HCl gas.

The process of the invention is particularly effective for fabricating a semiconductor laser having a plurality of ridges, in which the ridges are located so closely to each other that they can have an influence on the resulting laser characteristics, e.g., a TS laser.

Also, the process of the invention is applicable to fabricating every semiconductor laser having a double-heterostructure. It is noted, however, that the invention is best suited for fabricating a TS laser, because thickness control can be carried out with accuracy higher than that achieved in the prior art.

BRIEF DESCRIPTION OF THE DRAWINGS

The invention will now be explained, more specifically but not exclusively, with reference to the accompanying drawings, in which.

Figure 1:
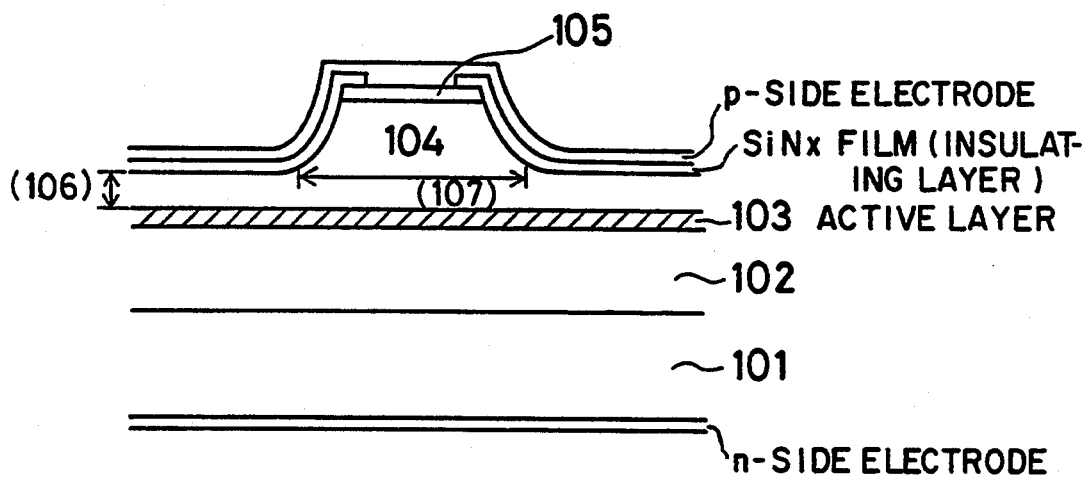
FIG. 1 is a schematic of the structure of a ridge waveguide type of semiconductor laser element.
Figure 2:
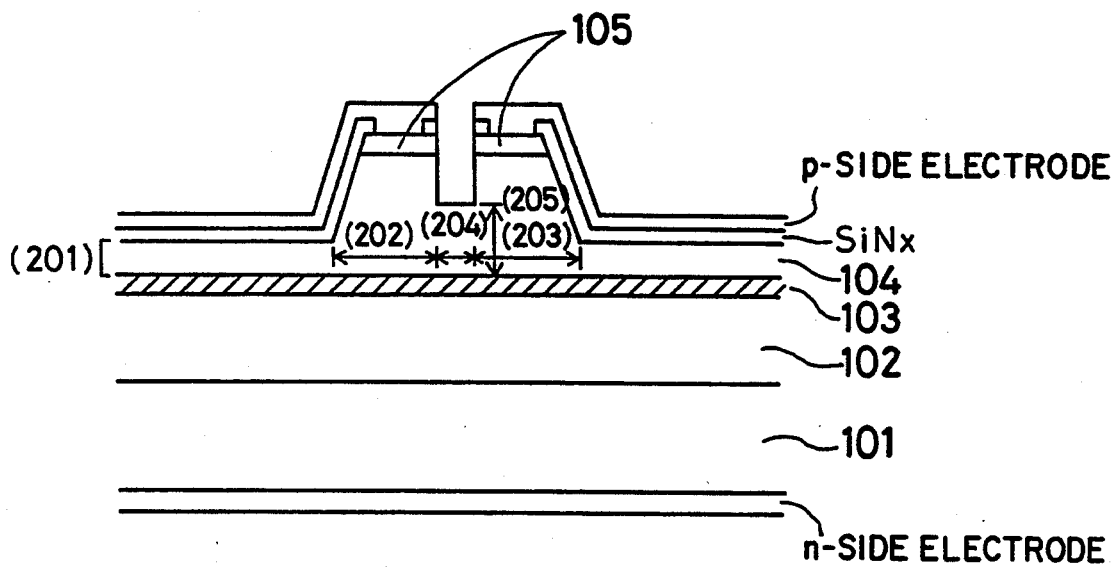
FIG. 2 is a schematic of the structure of a twin-striped laser element.
Figure 3A:
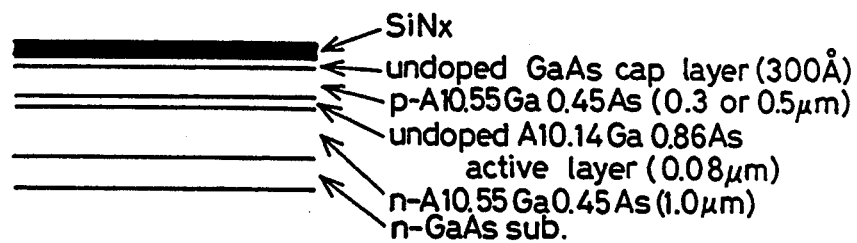
FIG. 3 is a schematic illustrating one example of the process of fabricating a semiconductor laser according to the invention.
Figure 3B:
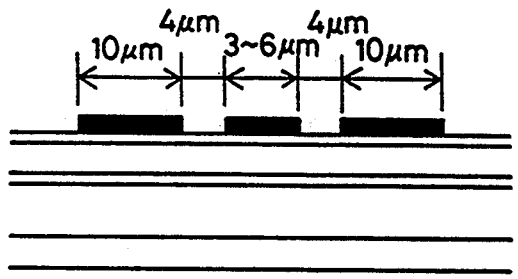
Figure 3C:
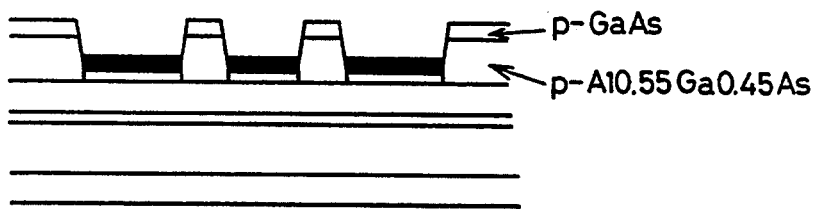
Figure 3D:
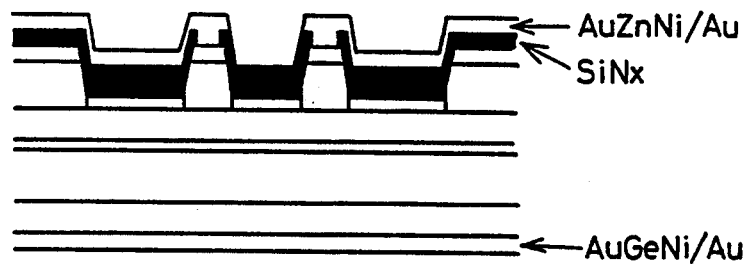

Throughout the drawings, reference numeral 101 is a substrate, 102 an n-type cladding layer, 103 an active layer, 104 a p-type cladding layer, 105 a p-type contact layer, 106 the thickness of the remaining cladding layer, 107 a ridge width, 201 the thickness of the remaining cladding layer, 202 a ridge width, 203 a ridge width, 204 a stripe-to-stripe distance, and 205 an etching depth of striped groove.

DETAILED EXPLANATION OF THE INVENTION

The most important feature of the fabrication process according to the invention is that the second cladding layer be formed to the thickness needed to provide the thickness of the remaining cladding layer, followed by the growth of the third cladding layer. Since this can dispense with etching, the accuracy of laser fabrication can be increased, resulting in some considerable improvement in the obtained laser semiconductor laser element.

In a preferable embodiment of the invention, halide or halogen gas is introduced, simultaneously with the feed gases, in a growth chamber during the growth of the third cladding layer, thereby preventing the deposition of polycrystals on the selective growth protecting films. In particular, this treatment is needed for the case where an aluminum-containing compound semiconductor is used for the third cladding layer.

In another preferred embodiment of the invention, a thin film is continuously grown on the surface of the grown substrate just after the completion of the first growth step, thereby preventing any deterioration of the quality of the crystal on the re-growth interface. Just before the second growth step this thin film is removed, immediately followed by the second growth step.

EXAMPLE

In the following description, the invention will now be explained more specifically with reference to FIG. 3. It is understood, however, that invention is not limited to the illustrated example, and so many modifications may be made thereto without departing from the scope and spirit defined in the appended claims.

FIG. 3 is a schematic of this example. As shown in FIG. 3(a), a double-heterostructure (DH) is grown on a n-type GaAs substrate by an MOVPE technique. Then, an SiNx film (with a thickness of 1000 Å) is applied on the surface of this DH epitaxial wafer by means of a plasma CVD technique. Two sets of striped window regions (each with a width of 3 μm) are formed with a space of 3 to 5 μm between them, while additional window regions are formed on the outside of these two sets of stripes with 10-μm wide SiNx films, as shown in FIG. 3(b). This sample is re-introduced in the MOVPE reactor, in which a surface GaAs cap layer (300 Å) is etched away by HCl gas, using SiNx as the mask. Following this, a p-type $Al_{0.55}Ga_{0.45}As$ cladding layer and a p-type GaAs contact layer are selectively grown in these window regions in a continuous manner, as shown in FIG. 3(c). This p-type $Al_{0.55}Ga_{0.45}As$ layer, when selectively grown by conventional growth techniques, is likely to give rise to the deposition of polycrystals on the mask due to the reaction between the Al-containing growth species and the mask. According to this example, this is avoided by the introduction of a small amount of HCl gas during the growth, because highly selective epitaxy (HSE) improved in terms of selectivity occurs, whereby the deposition of polycrystals on the mask is inhibited. An SiNx film is again applied on the entire surface of the sample, and windows are formed in only the upper regions of the stripes so as to enable currents to be injected in the two ridges independently, followed by the deposition of an electrode (AuZn-Ni/Au). Also, an electrode (AuGeNi/Au) is deposited on the entire surface of the back side of the sample, as shown in FIG. 3(d).

Figure 4:
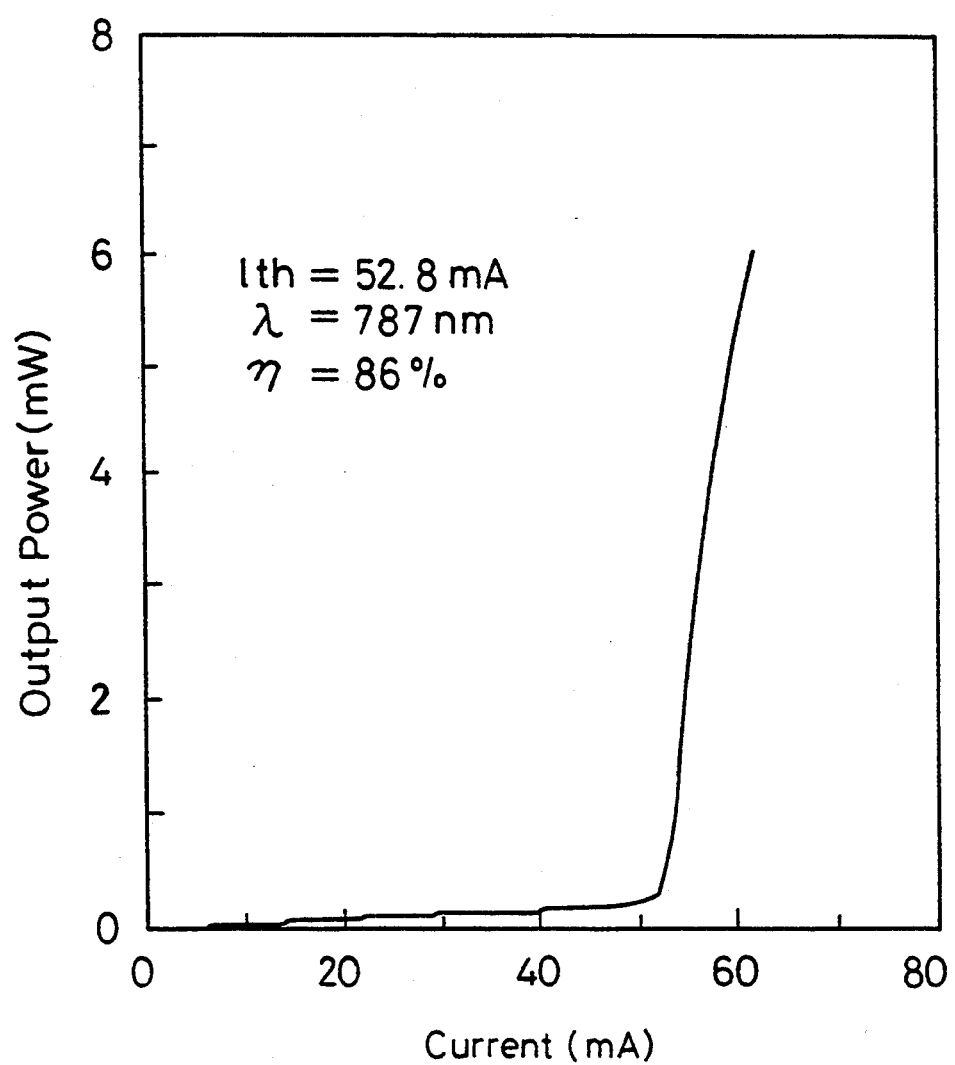
FIG. 4 is a plot of output power vs. current of the SA-TS laser fabricated according to the example of the invention.

FIG. 4 is a plot of output power vs. current when an current is implanted on one side alone of the thus fabricated SA-TS laser. The threshold current is 52.8 mA, the driving current is 61.7 mA at 6 mW, the oscillation wavelength is 787 nm, and the external differential quantum efficiency is 86% on both sides, all high-enough values. When a current is injected on the opposite ridge, these laser characteristics vary within only a few percentage. This implies that a symmetrical ridge structure can be obtained with high accuracy according to the invention.

What is claimed is:

1. A process for fabricating a semiconductor laser by forming a double-heterostructure made up of a first cladding layer, an active layer and a second cladding layer on a semiconductor substrate at the first growth step, forming protecting films for selective growth on both sides of a striped region for current injection, without etching the second cladding layer, and growing a third cladding layer and a contact layer for current injection at a second growth step, wherein the second cladding layer formed at the first growth step is grown to the thickness required for achieving laser characteristics.

2. A process as claimed in claim 1, wherein the semiconductor laser element is a twin-striped laser element.

3. A process as claimed in claim 2, wherein the distance between one set of ridges of the twin-striped laser element is 3 to 5 μm.

4. A process as claimed in claim 1, wherein the selective growth is carried out by a vapor-phase growth technique using an organic metal and, at the same time, halide or halogen gas is introduced in a growth chamber during the selective growth so as to prevent the deposition of polycrystals on the protecting films for selective growth.

5. A process as claimed in claim 4, wherein the halide or halogen gas is HCl gas.

* * * * *

REEXAMINATION CERTIFICATE (3738th)

United States Patent [19]

[11] B1 5,376,581

Shimoyama et al.

[45] Certificate Issued Feb. 23, 1999

[54] FABRICATION OF SEMICONDUCTOR LASER ELEMENTS

[75] Inventors: Kenji Shimoyama; Yuichi Inoue; Hideki Gotoh, all of Ushiku, Japan

[73] Assignee: Mitsubishi Chemical Corporation, Tokyo, Japan

Reexamination Request:
No. 90/004,936, Mar. 6, 1998

Reexamination Certificate for:
Patent No.: 5,376,581
Issued: Dec. 27, 1994
Appl. No.: 118,792
Filed: Sep. 10, 1993

[30] Foreign Application Priority Data

Sep. 11, 1992 [JP] Japan .................. 4-243699

[51] Int. Cl.$^6$ .............................................. H01L 21/20
[52] U.S. Cl. .................. 438/39; 438/29; 438/289; 438/496; 148/DIG. 95
[58] Field of Search ........................... 438/29, 39, 289, 438/496; 148/DIG. 95

[56] References Cited

U.S. PATENT DOCUMENTS 4,783,425  11/1988  Fukuzawa et al. .

*Primary Examiner*—Robert M. Kunemund

[57] ABSTRACT

In a process for fabricating a semiconductor laser by forming a double-heterostructure made up of a first cladding layer, an active layer and a second cladding layer on a semiconductor substrate at the first growth step, forming protecting films for selective growth on both sides of a striped region for current injection, without etching the second cladding layer, and growing a third cladding layer and a contact layer for current injection at a second growth step, the second cladding layer formed at the first growth step is grown to the thickness required for achieving laser characteristics.

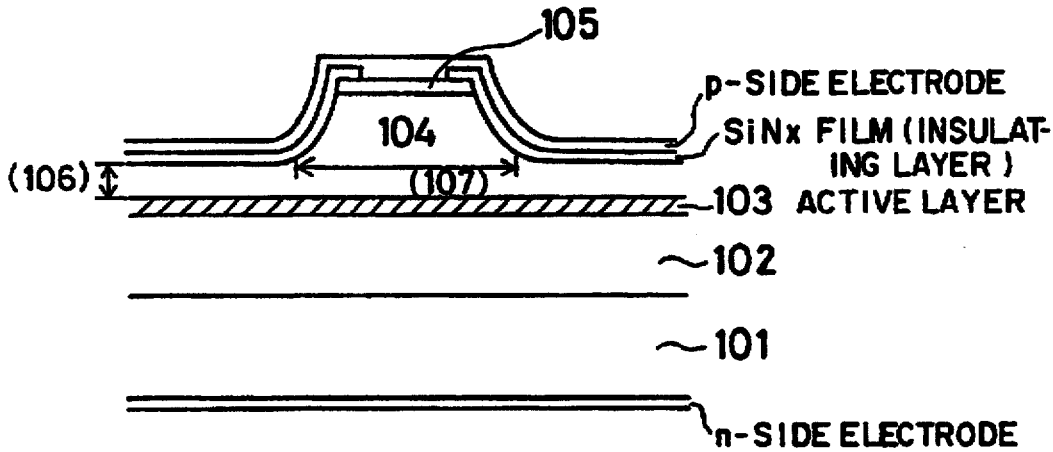

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1 to 5 is confirmed.

* * * * *